United States Patent [19]
Eichhorn et al.

[11] Patent Number: 5,772,789
[45] Date of Patent: Jun. 30, 1998

[54] FLUX-REMOVING AQUEOUS CLEANING COMPOSITION AND METHOD OF USE

[75] Inventors: Eric E. Eichhorn, Princeton; Francis R. Cala, Highland Park, both of N.J.

[73] Assignee: Church & Dwight Co., Inc., Princeton, N.J.

[21] Appl. No.: 752,141

[22] Filed: Nov. 19, 1996

[51] Int. Cl.$^6$ ....................................................... B08B 7/00
[52] U.S. Cl. .................................. 134/40; 134/2; 134/42; 510/175
[58] Field of Search ................................. 510/175; 134/1, 134/2, 40, 42

[56] References Cited

U.S. PATENT DOCUMENTS

| | | | |
|---|---|---|---|
| 5,234,505 | 8/1993 | Winston et al. | 134/40 |
| 5,234,506 | 8/1993 | Winston et al. | 134/40 |
| 5,549,761 | 8/1996 | Winston et al. | 134/40 |

*Primary Examiner*—Scott W. Houtteman
*Attorney, Agent, or Firm*—Irving Fishman

[57] ABSTRACT

An aqueous cleaning composition which is capable of removing soldering flux residues, particularly water-soluble flux residues, from a surface of an electronic assembly without leaving significant amounts of white residue on the surfaces of cleaning equipment used in the flux-removal process, contains: (A) a flux-removing portion containing an alkaline salt component composed of at least one potassium salt; and (B) an aqueous portion in which the flux-removing portion is disposed. The composition has a non-potassium alkali metal content of no greater than about 5% by weight. Preferably, the alkaline salt component consists essentially of a potassium salt or mixture of potassium salts, most preferably potassium carbonate or a mixture of potassium carbonate salts. A method of substantially removing soldering flux residues from an electronic assembly surface without leaving significant amounts of white residue on surfaces of cleaning equipment used in the flux-removal method involves applying the aforementioned cleaning composition onto the electronic assembly surface for a period of time sufficient to substantially saponify the flux residues so as to form saponified flux residues, and then removing the saponified flux residues from the electronic assembly surface.

17 Claims, No Drawings

FLUX-REMOVING AQUEOUS CLEANING COMPOSITION AND METHOD OF USE

BACKGROUND OF THE INVENTION

The present invention is directed to aqueous cleaning compositions useful in removing flux residues from circuit assembly cleaning equipment. More particularly, this invention relates to aqueous, alkaline salt-based cleaning compositions which leave significantly reduced levels of "white" residues on the surfaces of cleaning equipment used in the flux-removing process.

The cleanliness of electronic circuit assembly cleaning equipment is generally regarded as being critical to the continuous use of a cleaning agent for circuit assemblies. Ionic and nonionic contamination on a circuit assembly can lead to premature failure of the assembly by allowing short circuits to develop therein. Often, this requirement for assembly cleanliness extends to the washing equipment itself on the part of the assembler. At the very least, equipment covered with white residues is often viewed as presenting the wrong image to potential customers. This perception can prevent the use of proven non-ozone-depleting, salt-based cleaning agents.

Ionic and nonionic contamination of an electronic circuit assembly often occurs during fabrication of the assembly. In the fabrication process, materials used to form the assembly are plated, etched, handled by operators in assembly, coated with corrosive or potentially corrosive fluxes, and soldered. Soldering fluxes are applied to the substrate assembly material to ensure firm, uniform bonding of the solder. Unfortunately, if not carefully removed after the soldering process, soldering flux residues can lead to circuit failure.

Soldering fluxes fall into three broad categories: rosin fluxes, water-soluble fluxes, and no-clean fluxes.

Rosin fluxes, which have a relatively long history of use and are still widely used in the electronics industry, are generally only moderately corrosive. Water-soluble fluxes, which are a more recent development and which are increasingly used in the electronics industry, are highly corrosive materials. No-clean fluxes, a very recent development, reportedly do not require removal from the circuit assemblies. Unfortunately, residues of any flux are believed to cause circuit failure if residual traces of the material are not carefully removed following soldering and, thus, remain on the electronic circuit assembly. Certain circuit board assemblers even require the removal of no-clean flux residues from circuit boards.

Traditionally, rosin fluxes have been removed from printed circuit boards by means of chlorinated hydrocarbon solvents, mixtures of such solvents or other volatile organic solvent materials. The use of such solvents is disadvantageous in view of the toxicity and environmental problems inherent in such materials and, accordingly, the use of such solvents has been subjected to close scrutiny by various government agencies.

To replace these solvent materials for use in cleaning rosin flux residues from circuit assemblies, the present assignee has developed the ARMAKLEEN® cleaner which is an aqueous-based cleaner comprising alkali metal salts such as alkali metal carbonate and/or alkali metal bicarbonate salts, alkali metal silicates for use as a corrosion inhibitor as well as organic adjuvants such as surfactants to improve the efficacy of cleaning, anionic polymers to stabilize the silicate in solution as well as hydrotropes to maintain the surfactants in aqueous solution. Such aqueous-based rosin flux-removing cleaners are described, for example, in U.S. Pat. Nos. 5,234,505 and 5,234,506, which are hereby incorporated by reference herein. These aqueous-based cleaners have been found to be very effective for removing rosin flux residues and are substantially safer to use than the previous organic solvent-based cleaners.

However, to avoid the use of the chlorinated or hydrocarbon solvents generally employed to remove rosin flux residues subsequent to soldering printed circuit boards, there has been a considerable increase in the use of aqueous-based solder fluxes which can be washed subsequent to the soldering operation by means of aqueous detergent solutions or pure water.

The aforementioned ARMAKLEEN® cleaner developed by the present assignee is also useful in removing such water-soluble aqueous-based flux residues. Typically, the particular ARMAKLEEN® cleaning formulation used to remove such residues contains a combination of potassium bicarbonate and sodium carbonate monohydrate. It has been found, however, that when this combination of material dries, it leaves a "white residue" on the surface of the cleaning equipment used in the flux-removing process. The white residue is visually unappealing and causes many customers to complain about the appearance of the cleaning equipment.

It would be desirable to provide a means for preventing, or at least reducing, the formation of white residue on the surface of the cleaning equipment used in the flux-removing process.

Accordingly, a primary object of the present invention is to provide a cleaning composition which is capable of removing aqueous-based soldering flux residues from the surfaces of electronic assemblies without leaving significant amounts of white residue on the surfaces of the cleaning equipment used in the flux-removing process.

A further object of the present invention is to provide a cleaning composition which leaves substantially transparent residues, if any, on the surfaces of the cleaning equipment used in the flux-removing process.

Another object of the present invention is to provide a cleaning composition which leaves substantially transparent and relatively easy to remove residues, if any, on the surfaces of the cleaning equipment used in the flux-removing process.

An additional object of the present invention is to provide a flux-removing method using a cleaning composition having the characteristics set forth in the preceding objects.

These and other objects which are achieved according to the present invention can be readily discerned from the following description.

SUMMARY OF THE INVENTION

The aforementioned objects are achieved in the present invention by using an aqueous alkaline salt-based cleaning composition which contains only potassium salts as the alkaline salt component therein.

The present invention is based on the discovery that the use of potassium salts as the sole alkaline salt component in an aqueous alkaline salt-based cleaning composition not only removes soldering flux residues (particularly water-soluble flux residues) from the surfaces of electronic assemblies but also leaves significantly reduced levels of white residue on the surfaces of cleaning equipment used in the flux-removing process or which are otherwise in contact with the cleaning composition. The present invention is further based on the discovery that the use of sodium salts, alone or in combination with potassium salts, in the alkaline salt component results in the formation of the aforementioned white residue on the surfaces of the cleaning equipment.

In particular, the present invention provides an aqueous alkaline salt-based cleaning composition and method of using same, wherein the composition contains:

(A) a flux-removing portion containing an alkaline salt component composed of at least one potassium salt; and (B) an aqueous portion in which the flux-removing portion is disposed;

wherein the cleaning composition has a non-potassium alkali metal content of no greater than about 5% by weight.

As stated above, the cleaning composition of this invention not only removes soldering flux residues from electronic circuit assemblies but also leaves significantly reduced levels of white residue on the surfaces of the cleaning equipment used in the flux-removing process.

Furthermore, any residues which are left by the cleaning composition of this invention on the surfaces of cleaning equipment are substantially transparent when such residues are dry, which makes the residues less noticeable and therefore less objectionable to customers.

In addition, such transparent residues left by the cleaning composition of this invention tend to remain wet for a prolonged period of time, which makes such residues easier to remove for a longer period of time than the white residue left by conventional cleaners.

DETAILED DESCRIPTION OF THE INVENTION

The aqueous alkaline salt-based cleaning composition of this invention removes soldering flux residues, particularly water-soluble flux residues, from electronic assembly surfaces without leaving significant amounts of white residue on the surface of the cleaning equipment used in the flux-removing process. The cleaning composition contains (A) a flux-removing portion containing an alkaline salt component and (B) an aqueous portion in which the flux-removing portion is disposed. The alkaline salt component contains at least one potassium salt and the non-potassium alkali metal content in the cleaning composition is no greater than about 5% by weight. The aqueous portion preferably consists essentially of water.

As used herein, the term "flux-removing portion" is intended to define the mixture of essentially active ingredients composed of the alkaline salt component and additional performance enhancers such as silicate corrosion inhibitors and any other adjuvants such as surfactants, antifoam agents, hydrotropes, and the like, as hereinafter described.

The term "non-potassium alkali metal content" as used herein refers to the content of alkali metal ions other than potassium ions, e.g., sodium.

The cleaning compositions of this invention are most preferably provided as aqueous concentrates which are then diluted to solution form for use in the flux-removing method described herein. The terms "aqueous cleaning composition" and "cleaning composition" as used herein are meant to include both concentrate and solution formulations of the cleaning composition.

It is important to the achievement of the objects of this invention that the cleaning composition of this invention have a non-potassium alkali metal content of no greater than about 5% by weight, preferably no greater than about 1% by weight, and most preferably 0% by weight (wherein the composition is devoid of alkali metals other than potassium). If the non-potassium alkali metal content of the aqueous cleaning composition is too high, white residue will form on the surface of the cleaning equipment used in the cleaning (flux-removing) process.

The alkaline salt component of the composition of this invention contains at least one potassium salt. Preferably, the alkaline salt component of the composition consists essentially of at least one potassium salt and contains no sodium salts or salts of other non-potassium alkali metals.

Preferred potassium salts are the carbonates, which are economical, safe and environmentally friendly. Potassium carbonate has the benefit of being much easier to get into solution which may prevent the residue left by the cleaning composition of this invention from drying on certain areas of the cleaning equipment.

Suitable potassium carbonate salts include, e.g., potassium carbonate, potassium carbonate dihydrate, potassium carbonate trihydrate, potassium carbonate decahydrate, potassium carbonate heptahydrate, potassium carbonate monohydrate, potassium sesquicarbonate and the double salts and mixtures thereof.

More preferably, the alkaline salt component contains a mixture of potassium carbonate salts.

Potassium bicarbonates can be used but these salts are not preferred.

In the cleaning composition of this invention, the alkaline salt component is preferably used in an amount which is sufficient to provide the cleaning composition with a pH of at least about 11, more preferably a pH of from about 11.5 to about 13.

In preferred embodiments, the flux-removing portion of the composition of this invention contains from about 45% to about 60% by weight of the alkaline salt component.

As mentioned hereinabove, the flux-removing portion of the cleaning composition of this invention preferably includes a silicate corrosion inhibitor, preferably an alkali metal silicate. Alkali metal silicates prevent corrosion or pitting of connecting tabs or solder joints, metals or other materials present in the electronic circuit assembly being cleaned. Alkali metal silicates also promote the brightness and shininess of the solder joints, and provide additional alkalinity to the aqueous cleaning composition to help cleaning.

Alkali metal silicates which can be used in the present invention include those disclosed, e.g., in U.S. Pat. No. 5,234,505, which was previously incorporated by reference herein. Suitable alkali metal silicates include those having the general formula $[Alk]_2O:SiO_2$, wherein [Alk] represents the alkali metal and in which the ratio of the two oxides can vary. Most useful alkali metal silicates will have an $[Alk]_2O$ to $SiO_2$ mole ratio of between 1:0.5 to 1:4.5. Most preferably, the $[Alk]_2O$ to $SiO_2$ ratio is between 1:1.6 and 1:4.0.

Potassium silicate is the most preferred alkali metal silicate for use in the present invention.

In the cleaning composition of this invention, the corrosion inhibitor is preferably present in an amount ranging from about 0.1% to about 10% by weight of the flux-removing portion of the composition.

A drawback to the use of alkali metal silicates in aqueous solutions having relatively low pH levels is that the silicate tends to precipitate from the aqueous solution. The silicate may be stabilized and maintained in solution by adding an anionic polymer to the solution. Suitable anionic polymers are disclosed, e.g., in U.S. Pat. No. 5,234,505, which has previously been incorporated by reference herein. However, a drawback to the use of such anionic polymers is that these polymers tend to make the solution undesirably viscous and difficult to use.

Silicates may also be stabilized and maintained in solution by using a solution having a sufficiently high pH. This approach is preferred in the present invention because of the viscosity problems associated with the use of the anionic polymers discussed hereinabove. Thus, in preferred embodiments, the aqueous cleaning composition used in the present invention is substantially devoid of silicate-stabilizing anionic polymers and, as discussed previously herein, has a pH of at least about 11 and more preferably a pH of greater than 11.5 to about 13.

The flux-removing portion of the cleaning composition of the present invention may further contain at least one antifoam agent.

Examples of preferred antifoam agents which can be used in the present invention include those disclosed in U.S. Pat. No. 5,234,505, which has been previously incorporated by reference herein. Such compounds include those formed by condensing ethylene oxide with a hydrophobic base formed by the condensation of propylene oxide with propylene glycol. Examples of suitable antifoam agents include the "Pluronics" agents sold by BASF—Wyandotte. These compounds also enhance flux removal.

Other antifoam agents that also enhance flux removal include: the polyethylene oxide/polypropylene oxide condensates of alkyl phenols having an alkyl group containing from about 6 to about 12 carbon atoms in either a straight chain or branched chain configuration, with ethylene oxide/propylene oxide, the ethylene oxide being present in amounts equal to 1 to 25 moles of ethylene oxide per mole of alkyl phenol and the propylene oxide being present in amounts equal to 1 to 25 moles of propylene oxide per mole of alkyl phenol. The alkyl substituent in such compounds may be derived from, e.g., polymerized propylene, diisobutylene, octene or nonene.

Other suitable antifoam agents include those derived from the condensation of ethylene oxide with the product resulting from the reaction of propylene oxide and ethylenediamine or from the product of the reaction of a fatty acid with sugar, starch or cellulose. The antifoam agent may be the condensation product of aliphatic alcohols having from 8 to 18 carbon atoms, in either straight chain or branched chain configuration, with ethylene oxide and propylene oxide.

In the aqueous concentrate formulation of the cleaning composition of this invention, the antifoam agent(s) is preferably present in an amount ranging from about 0.01% to 0.5% by weight of the concentrate.

The flux-removing portion of the aqueous cleaning composition of this invention may also contain one or more surfactants to enhance the wetting and saponifying ability of the aqueous composition and permit maximum penetration thereof into the regions of the cleaning apparatus most difficult to clean. The surfactant may be the same agent used to control foam. Suitable surfactants include anionic, nonionic, cationic surfactants or amphoteric surfactants or combinations thereof. The surfactants should be soluble, stable and preferably, non-foaming in use. A combination of surfactants may be used. The term "surfactant" as used herein may include other forms of dispersing agents or aids.

It has been found especially effective to use alkoxylated alcohols which are sold under the tradename of "Polytergent SL-Series" surfactants by Olin Corporation. Also, the polycarboxylated ethylene oxide condensates of fatty alcohols manufactured by Olin under the tradename of "Polytergent CS-1" have also been found effective, especially in combination with the above Polytergent SL-Series surfactants. An effective surfactant which also provides antifoam properties is "Polytergent SLF-18" also manufactured by Olin. A combination of this surfactant together with the above two surfactants has been found to provide excellent cleaning with low foam.

Other suitable surfactants include the block copolymers of ethylene oxide and propylene oxide such as those provided by BASF Corporation as Pluronics.

Ethoxylated alcohols with 8 to 20 carbons, such as those containing from 3 to 30 moles of ethylene oxide per mole of alcohol may also be used as surfactants in this invention.

In the aqueous cleaning composition of this invention, the surfactant is typically present in small amounts, preferably an amount which does not exceed about 15% by weight of the aqueous composition and which is preferably less than about 0.01% by weight in the dilute aqueous solution form of the concentrate mentioned hereinabove. The amount of surfactant will vary depending on the conditions and the contamination encountered, and higher surfactant levels may be used if so desired. Preferably, the aqueous concentrate formulation of the cleaning composition of this invention contains from about 0.01% to about 5.0% by weight of the surfactant(s). The amount of surfactant used in the solution formulation of the cleaning composition of this invention is usually small, e.g., less than 0.01% by weight of the solution, but the amount will vary depending on the conditions and the contamination encountered and higher surfactant levels may be used, if so desired.

It may be useful to include a hydrotrope in the aqueous cleaning composition of this invention to help solubilize any organic adjuvants such as surfactants, anti-foam agents, and the like, which are present in the salt-containing compositions. Optimally, the hydrotrope will be present in the aqueous concentrate formulation of the aqueous composition of this invention in an amount which does not exceed about 3% by weight, and preferably ranges from about 0.2% to about 3% by weight of the concentrate.

Hydrotropes suitable for use in this invention include those disclosed in U.S. Pat. No. 5,234,505, which has previously been incorporated by reference herein. Preferred hydrotropes include the alkali metal salts of intermediate chain length monocarboxylic fatty acids, i.e., $C_7$–$C_{13}$.

The cleaning composition of this invention may further contain potassium hydroxide. With respect to the aqueous concentrate formulation of the composition of this invention, the amount of potassium hydroxide will range from about 0% to about 10% by weight.

As stated previously herein, the cleaning compositions of this invention are most preferably provided as aqueous concentrates. The aqueous cleaning concentrate is typically used in the flux-removing method described herein at a dilution in water of about 10% by volume. Smaller or higher dilution rates are also within the scope of the present invention and most likely will range from dilutions of 5X to 20X based on the dilution of the concentrate. Deionized water is preferably used to form the concentrate and for diluting the concentrate and washing the circuit assemblies.

As an aqueous concentrate, the cleaning composition of this invention preferably comprises from about 5% to about 45% by weight of the flux-removing portion and from about 55% to about 95% by weight of the aqueous portion. As an aqueous solution, the cleaning composition of this invention will preferably contain from about 0.1% to about 15% of the flux-removing portion and from about 85% to about 99.9% by weight of the aqueous portion. The specific amount of water added to the concentrate to form the solution formulation of the composition of this invention will vary according to factors relating to manufacturing, packaging, shipping, and storage.

While the cleaning composition of this invention is preferably formulated in aqueous concentrate form and then further diluted, it is possible to formulate the cleaning composition in other forms known in the art and which can then be mixed with water for use.

In the present invention, additives, adjuvants and the like may be included with the flux-removing portion of the composition of this invention.

The present invention further provides a method of substantially removing soldering flux residues from a surface of an electronic assembly without leaving significant amounts of white residue on the surfaces of cleaning equipment used in the flux-removing process. Such method involves the steps of:

(1) applying onto the surface of the electronic assembly the aqueous cleaning composition of this invention; wherein the composition is applied against the surface of the electronic assembly for a period of time sufficient to substantially saponify the flux residues so as to form saponified flux residues; and (2) removing the saponified flux residues from the surface of the electronic assembly.

Use of the cleaning composition of this invention in the method described above results in significantly reduced amounts of white residues on the surfaces of the cleaning equipment used in the flux-removing process.

The cleaning composition of this invention is capable of removing any type of water-soluble soldering flux from circuit assemblies. Examples of such water-soluble fluxes include organic acids such as lactic, citric, oleic, stearic and gluconic acids; organic hypohalides such as aniline hypochloride, glutamic acid hypochloride, dimethyl ammonium chloride; amines such as urea and triethanolamine; and amides; and the like. Besides the water-soluble flux residues, the cleaning composition is believed capable of removing other contaminants which may be present on circuit assemblies including but not limited to photoresist, solder masks, adhesives, machine oils, greases, silicones, lanolin, mold release agents, polyglycols, plasticizers and the like.

The cleaning composition of this invention can be used to clean any type of circuit assembly which contains water-soluble fluxes which are to be removed. Accordingly, the type of assembly structure to be cleaned is not believed to be critical to the invention. The assembly manufacturing process involves the placement of components such as integrated circuits, resistors, capacitors, diodes, and the like, on the surface of a board or their insertion through pre-drilled holes. The components are then secured by soldering by mechanical or automatic means. Interspersed with the soldering operations are cleaning procedures and inspections to ensure that tape and solder flux residues that could lead to premature circuit failure do not remain.

For the removal of soldering flux deposits and other residues during printed circuit/wiring board fabrication, the compositions of the invention may be applied to the boards by immersion in dip tanks or by hand or mechanical brushing. Alternatively, the compositions of this invention may be applied by any of the commercially available printed wiring board cleaning equipment. Dishwasher size units may be used, or much larger in-line conveyor-type cleaning systems such as the various "Hydro-station" models produced by Electovert of Grand Prairie, Tex.

Depending upon their design, these washers may apply the cleaning compositions of this invention by spraying with mechanical nozzles, by rolling contact with wetted roller surfaces or by ultrasonic immersion.

Once the solder flux has been loosened and removed during a period of contact which typically ranges from about 1 to about 10 minutes, the boards are taken from the flux-removing composition. Then, the boards may simply be flushed with water (preferably deionized water) for a period of up to about 2 minutes. The optimal rinsing time varies according to the kinds of surfactants and concentrations of the cleaning composition used and can easily be determined by routine experimentation. The cleaned boards are then dried, preferably with forced air. Drying is expedited if the air is warmed, preferably to a temperature of more than about 100° F.

As stated previously herein, with the use of conventional alkaline salt-based cleaners, white residue forms on the surface of the equipment used in the cleaning process. For example, white residue may form on the inside of wash and rinse tanks, on spray or application nozzles which may be used to apply the cleaning solution, on the outside of wash or rinse tanks due to any spillage or draining operation and over the conveyor assembly, if used. The white residue is unsightly and unappealing to both the assemblers and the customers.

However, the cleaning composition of this invention leaves greatly reduced amounts of white residue on the surface of the cleaning equipment. Any residues which are left are substantially transparent. In addition, any residues left by the composition of this invention on the cleaning equipment surface tends to remain wet for extended periods of time. This makes the residues less likely to dry on the equipment surface and easier to remove than the white residue.

The following examples are provided to further illustrate but not to limit the present invention.

Experimental

Example 1

In Example 1, a cleaning composition within the scope of this invention was prepared in concentrate form having the formulation shown in Table I below. This formulation represents a particularly preferred embodiment of the composition of this invention.

TABLE I

Example 1: Formulation

| Ingredient | Concentration (wt. %) |
| --- | --- |
| potassium carbonate | 9.70 |
| potassium hydroxide | 0.28 |
| potassium silicate | 11.00* |
| surfactants/hydrotropes | 4.61 |
| water | 74.41 |
| pH | 11.3–11.5 |

*The potassium silicate was provided as a 29.1% solution, thus the 11.00% set forth in Table I is actually about 3.2% actual silicate.

The cleaning composition of this invention having the formulation shown in Table I above contained no suspending agent (e.g., sodium polyacrylate) to keep the materials in solution. The composition had a significantly high level of silicate and a high pH so as to keep the silicate in solution. Furthermore, the composition prepared in Example 1 derived all of its alkalinity from potassium carbonate.

Control Examples A–C

In Control Examples A–C, three aqueous compositions outside the scope of the present invention were prepared in concentrate form. The specific formulations of the concentrates prepared in Example 1 and Control Examples A–C are presented in Table II below.

TABLE II

Example 1 and Control Examples A–C:
Formulations

| Ingredient | Example Concentration (wt. %) | | | |
|---|---|---|---|---|
| | 1 | A | B | C |
| potassium carbonate | 9.70 | 7.81 | 7.81 | 5.15 |
| sodium monohydrate | — | 6.90 | 6.90 | 4.55 |
| sodium bicarbonate | — | 0.34 | — | — |
| sodium hydroxide | — | 0.45 | 0.68 | 0.28 |
| potassium hydroxide | 0.28 | — | — | — |
| potassium silicate | 11.00 | 1.09 | 4.73 | 3.12 |
| sodium polyacrylate | — | 0.90 | 0.90 | — |
| surfactants/ hydrotropes | 4.61 | 3.5 | 3.5 | 4.58 |
| water | 74.41 | 79.01 | 75.49 | 82.33 |
| pH | 11.3–11.5 | 10.90 | 11.30 | 11.40 |

The aqueous concentrates prepared in Example 1 and Control Examples A–C were each diluted with water to form four aqueous cleaning solutions. Four test slides were contacted with the solutions (one slide per solution) but were not rinsed after such contact. The amount and appearance of residue left behind on the surfaces of the test slides after contact with the solutions were then evaluated. The results are presented in Table III below. In Table III, the term "Solution Wt." refers to the weight in grams of the solution used to contact the test slides. The term "Residue Wt." refers to the weight in grams of the residue left behind on the test slide after contact with the solution. The term "% Wt." refers to the percentage of the solution which is left behind as residue.

TABLE III

Example 1 and Control Examples A–C:
Residue Evaluation Results

| Ex. No. | Solution Wt. (g) | Residue Wt. (g) | % Wt. | Comments - Residue |
|---|---|---|---|---|
| 1 | 23.988 | 4.853 | 20.23 | clear, wet after 48 hrs |
| A | 23.624 | 4.593 | 19.44 | white |
| B | 21.004 | 5.570 | 26.52 | white, heavy |
| C | 27.938 | 5.210 | 18.65 | similar to but not as heavy as residue of Control Example A |

As shown in Table III above, while each test solution left behind a similar amount of residue on the test slides, the solutions used in the Control Examples each left behind a white residue on the slide, while the test solution of the present invention (Example 1) left behind a transparent residue. Furthermore, the residue left behind by the solution of the present invention was still wet even after 48 hours. This is because potassium carbonate picks up moisture from the air and maintains a liquid state above a humidity of 45%. This makes the residue formed from the invention solution easier to rinse and less likely to dry on the machine surface.

What is claimed is:

1. An aqueous cleaning concentrate capable of removing soldering flux residues from a surface of an electronic assembly without leaving significant amounts of white residue on surfaces of cleaning equipment used in removing said flux residues with said composition, said concentrate comprising:
   (A) a flux-removing portion containing an alkaline salt component, wherein the alkaline salt component consists of one or more potassium carbonate salts; and
   (B) an aqueous portion in which said flux-removing portion is disposed;
   wherein said cleaning concentrate has a non-potassium alkali metal content of 0% by weight;
   further wherein said cleaning concentrate is capable of forming wet residues on the surfaces of the cleaning equipment, wherein all or substantially all of said wet residues are transparent.

2. A composition according to claim 1, wherein said cleaning composition has a pH of at least about 11.30.

3. A composition according to claim 1, wherein said cleaning composition has a pH of from about 11.30 to about 11.50.

4. A composition according to claim 1, wherein said flux-removing portion further comprises at least one alkali metal silicate.

5. A composition according to claim 4, wherein said alkali metal silicate is potassium silicate.

6. A composition according to claim 4, wherein said cleaning composition comprises from about 1% to about 15% by weight of said alkali metal silicate.

7. A composition according to claim 4, wherein said composition is substantially devoid of an anionic polymer for stabilizing said alkali metal silicate.

8. A composition according to claim 1, wherein said flux-removing portion further comprises at least one surfactant.

9. A composition according to claim 1, wherein said flux-removing portion further comprises at least one hydrotrope.

10. A method of substantially removing soldering flux residues from a surface of an electronic assembly without leaving significant amounts of white residue on surfaces of cleaning equipment used in said method of removing said flux residues, said method comprising the steps of:
   (1) providing a wholly carbonate-based aqueous cleaning concentrate comprising:
      (A) a flux-removing portion containing an alkaline salt component, wherein the alkaline salt component consists of one or more potassium carbonate salts; and
      (B) an aqueous portion in which said flux-removing portion is disposed;
      wherein said cleaning concentrate has a non-potassium alkali metal content of 0% by weight; further wherein said cleaning concentrate is capable of forming wet residues on the surfaces of the cleaning equipment, wherein all or substantially all of said wet residues are transparent;
   (2) applying said aqueous cleaning concentrate as an aqueous solution onto said surface of said electronic assembly such that portions of said aqueous cleaning solution come into contact with the surfaces of the cleaning equipment and form said wet transparent residues on the surfaces of the cleaning equipment, wherein the solution is applied against said surface of said electronic assembly for a period of time sufficient to substantially saponify the flux residues so as to form saponified flux residues; and (3) removing said saponified flux residues from said surface of said electronic assembly.

11. A composition according to claim 1, wherein said transparent wet residues are capable of remaining wet for a period of about 48 hours after formation thereof by said cleaning composition.

12. A composition according to claim 1, wherein the cleaning composition has a pH of from about 11.30 to about 11.50 and said flux-removing portion further comprises at least one alkali metal silicate, further wherein said cleaning composition is devoid of an anionic polymer for stabilizing said alkali metal silicate.

13. A method according to claim 10, further comprising the step (4) of rinsing said wet residues from said surfaces of the cleaning equipment about 48 hours after completion of step (2).

14. A method according to claim 10, wherein said aqueous cleaning composition has a pH of at least about 11.30.

15. A method according to claim 10, wherein said aqueous cleaning composition has a pH of from about 11.30 to about 11.50.

16. A method according to claim 15, wherein said flux-removing portion of said aqueous cleaning composition further comprises at least one alkali metal silicate.

17. A method according to claim 16, wherein said composition is substantially devoid of an anionic polymer for stabilizing said alkali metal silicate.

* * * * *